Oct. 14, 1969 R. E. BOHN ETAL 3,473,047
HIGH SPEED DIGITAL LOGIC CIRCUIT HAVING NON-SATURATING OUTPUT TRANSISTOR
Filed Aug. 16, 1966
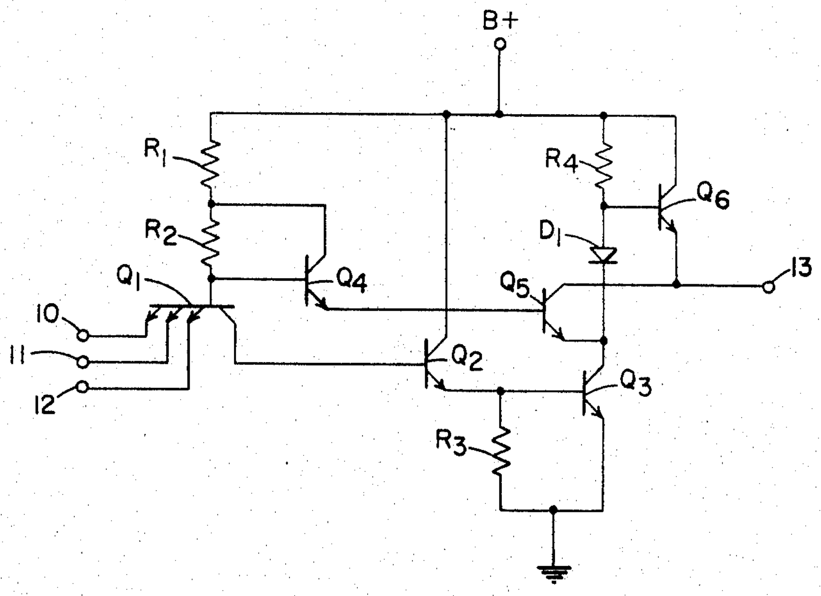
INVENTORS.
RICHARD E. BOHN and
PRAVIN B. PATEL
BY David M. Keay
AGENT.

United States Patent Office 3,473,047
Patented Oct. 14, 1969

3,473,047

HIGH SPEED DIGITAL LOGIC CIRCUIT HAVING NON-SATURATING OUTPUT TRANSISTOR

Richard E. Bohn, North Reading, and Pravin B. Patel, Cambridge, Mass., assignors to Sylvania Electric Products Inc., a corporation of Delaware Filed Aug. 16, 1966, Ser. No. 572,739
Int. Cl. H03k 19/34, 19/36
U.S. Cl. 307—215 6 Claims

ABSTRACT OF THE DISCLOSURE

TTL NAND logic circuit having a clamping transistor with its collector connected to an output terminal, its emitter connected to the collector of the output transistor, and its base coupled to the input transistor. When the output transistor conducts, the clamping transistor also conducts and clamps the voltage at the collector of the output transistor so as to prevent the output transistor from operating in saturation.

This invention relates to logic circuits. More particularly, it is concerned with high speed digital logic circuits employing transistors.

Digital logic circuits are widely used for performing the logical operations in computers and data processing equipment. Circuits employing semiconductor diodes and transistors have been designed and produced to provide the various necessary digital logic functions. With advances in the art of monolithic integrated circuit networks in which an entire circuit may be fabricated within a single die of semiconductor material, logic circuits which are particularly amenable to fabrication as monolithic integrated networks have been produced.

Various types of digital logic circuits have been developed for fabrication as integrated circuits. Of these, the so-called transistor-transistor type logic (TTL) has become widely accepted because of the availability of certain circuits having favorable switching speeds, power dissipation, immunity to noise, fan-out (the number of succeeding logic circuits which can be operated with parallel input connections to the output connection of a given logic circuit), and capacitive load driving capability. However, during one of the two operating states of a transistor-transistor logic circuit, the output transistor operates in saturation. Thus, there is an inherent delay in the switching speed of the circuit because of the time required to sweep out the charge carriers stored in the saturated output transistor.

It is an object of the present invention, therefore, to provide an improved logic circuit.

It is another object of the invention to provide a logic circuit wherein the switching speeds are not limited by the charge storage delay which occurs when a saturated transistor is switched from that condition.

A logic circuit in accordance with the foregoing objects of the invention has an output transistor circuit means connected to the input section of the circuit. In order to produce one of the two output signal conditions at the output terminal of the logic circuit the output transistor operates in a conducting condition to which it is biased by the input section. The output transistor is prevented from becoming saturated during operation in the conducting condition by a clamping means which includes a clamping transistor connected to the input section, to the collector of the output transistor, and to the output terminal of the circuit. When the input section causes the output transistor to be in the conducting condition, the clamping transistor is also biased to a conducting condition establishing a voltage level at the collector of the output transistor which prevents the output transistor from operating in saturation. A low impedance path from the output terminal is provided by the two conducting transistors thus establishing one of the two output signal conditions at the output terminal.

When the input section biases the output transistor to operation in a substantially non-conducting condition, a voltage setting transistor means connected to the output terminal establishes the other of the two signal conditions at the output terminal.

Additional objects, features, and advantages of logic circuits according to the invention will be apparent from the following detailed discussion and the accompanying drawing wherein the single figure is a schematic circuit diagram of a three-input NAND logic circuit embodying the features of the invention.

The NAND circuit shown in the figure includes a multiple-emitter NPN input transistor $Q_1$ having three emitters with three input terminals 10, 11, and 12 each connected to an emitter. The base of the input transistor $Q_1$ is connected through a resistance, shown as two resistances $R_1$ and $R_2$ in series, to a voltage source B+. The collector of the input transistor $Q_1$ is connected directly to the base of an NPN output coupling transistor $Q_2$. The collector of the transistor $Q_2$ is connected directly to the B+ voltage source and its emitter is connected through a resistance $R_3$ to ground. The emitter of transistor $Q_2$ is also connected directly to the base of an NPN output transistor $Q_3$. The emitter of the output transistor $Q_3$ is connected directly to ground and its collector is connected through a diode $D_1$ and a resistance $R_4$ in series to the B+ voltage source.

An NPN clamping coupling transistor $Q_4$ has its base connected directly to the base of the input transistor $Q_1$ and its collector connected at a point between the two base resistances $R_1$ and $R_2$. The emitter of the clamping coupling transistor $Q_4$ is connected directly to the base of an NPN clamping transistor $Q_5$. The emitter of the clamping transistor $Q_5$ is connected directly to the collector of the output transistor $Q_3$ and its collector is connected directly to the output terminal 13.

An NPN voltage setting transistor $Q_6$ has its collector connected directly to the B+ voltage source and its emitter connected directly to the output terminal 13. Its base is connected between the resistance $R_4$ and diode $D_1$ in the collector circuit of the output transistor $Q_3$.

When a low level voltage condition of no signal is present at one or more of the three input terminals 10, 11, and 12, current flows from the B+ voltage source through the base resistances $R_1$ and $R_2$ and across the forward biased base-emitter junctions of input transistor $Q_1$. The greatest voltage drop occurs across the resistances establishing a low voltage at the base of the input transistor $Q_1$. Under these conditions, although transistor $Q_1$ is operating in saturation, the voltage at its collector is low and current does not flow from the collector into the base of the output coupling transistor $Q_2$, and transistor $Q_2$ is in a substantially non-conducting condition. The base of the output transistor $Q_3$ is, therefore, at a low voltage level, and output transistor $Q_3$ is biased to a substantially non-conducting condition.

Output transistor $Q_3$ provides a high impedance between its collector and emitter when it is in the substantially non-conducting condition, and the voltage at its collector approaches that of the B+ voltage source. This relatively high voltage at the emitter of the clamping transistor $Q_5$ together with the relatively low voltage at the base of the clamping coupling transistor $Q_4$ cause transistors $Q_4$ and $Q_5$ to be biased to substantially non-conducting conditions. Thus, a high impedance path between the output terminal 13 and ground is provided by virtue of the substantially non-conducting conditions of the clamping transistor $Q_5$ and the output transistor $Q_3$. Under these conditions the voltage level at the output terminal 13 is the voltage at the B+ voltage source less the voltage drop caused by leakage current through resistance $R_4$ and across the base-emitter junction of the voltage setting transistor $Q_6$. The circuit can thus be considered "off" with the output signal at a relatively high voltage level as will be apparent hereinafter.

While a low voltage level no signal condition is present at one or more of the input terminals 10, 11, and 12, the signal at the output terminal 13 remains at the relatively high voltage level. When a positive signal condition, such as may be produced at the output of a similar logic circuit in the "off" condition, is present at all three input terminals 10, 11, and 12, the base-emitter junctions of the input transistor $Q_1$ become reverse biased reducing current flow through the resistances $R_1$ and $R_2$. Thus, the voltage at the base of the input transistor $Q_1$ increases biasing the transistor to conduction and causing current to flow into the base of the output coupling transistor $Q_2$. Heavy current flows through the output coupling transistor $Q_2$, and current in its emitter circuit flows into the base of the output transistor $Q_3$ switching that transistor to a high conduction condition.

Current flow in the collector circuit of the output transistor $Q_3$ lowers the voltage on the collector. This reduced voltage at the emitter of the clamping transistor $Q_5$ together with the increased voltage at the base of the clamping coupling transistor $Q_4$ forward biases transistors $Q_4$ and $Q_5$ switching them to high conduction conditions. Since both transistors $Q_5$ and $Q_3$ are in highly conducting conditions, a low impedance path is provided between the output terminal 13 and ground, and the voltage level at the output terminal is relatively low. The low voltage across the base-emitter junction of the voltage setting transistor $Q_6$ which is the voltage across diode $D_1$ less the voltage across the collector-emitter of the saturated clamping transistor $Q_5$ causes the voltage setting transistor $Q_6$ to remain in a substantially non-conducting condition. Under these conditions the circuit may be considered "on."

The clamping circuit including the clamping coupling transistor $Q_4$ and the clamping transistor $Q_5$ serves to prevent the output transistor $Q_3$ from operating in saturation. Heavy current flows through transistors $Q_4$ and $Q_5$. Transistor $Q_5$ operates in saturation but the voltage drop across the resistance $R_2$ prevents transistor $Q_4$ from becoming saturated. Under these conditions of heavy conduction the voltage at the collector of the output transistor $Q_3$ is prevented from dropping below the voltage at the base of the input transistor $Q_1$ less the base-emitter voltage drops across transistors $Q_4$ and $Q_5$. Since the base-emitter voltages of transistors $Q_4$, $Q_5$, $Q_2$, and $Q_3$ are all approximately the same, the emitter-to-collector voltage of the output transistor $Q_3$ is the same as the base-to-collector voltage of the input transistor $Q_1$. Thus, the collector-to-emitter voltage of the output transistor $Q_3$ is clamped, and the clamped voltage is such as to hold the transistor out of saturation.

Fast switching speed in switching the circuit "on" is obtained by heavy transient base drive to the output transistor $Q_3$. Heavy base drive is supplied by the emitter follower coupling transistor $Q_2$ which can provide virtually unlimited current without being saturated since there is no resistance in its collector circuit. The voltage at the collector of the output transistor $Q_3$ drops rapidly quickly turning on transistors $Q_4$ and $Q_5$. Heavy base drive from transistor $Q_4$ to the clamping transistor $Q_5$ rapidly drives transistor $Q_5$ into saturation pulling down the voltage level at the output terminal. The circuit can operate in this "on" condition with high fan-out because the transistors $Q_3$ and $Q_5$ are biased to high conduction and since there is no resistance in the low impedance path beteween the output terminal 13 and ground.

Transistor $Q_4$ also provides a stabilizing influence during operation of the circuit in the "on" condition. Under the operating conditions as described there may be some phase difference or time delay between the current flow in the collector circuit of the output transistor $Q_3$ caused by current flow in the collector of input transistor $Q_1$ and the clamping circuit flow caused by the voltage difference between the collector of output transistor $Q_3$ and the base of input transistor $Q_1$. These phase differences in the two components of the collector current may cause the circuit to oscillate. However, by appropriate choice of the ratio between resistances $R_1$ and $R_2$, the phase shift of transistor $Q_4$ may be adjusted so that the phase shifts of transistors $Q_4$ and $Q_5$ in combination are equal to the combined phase shifts of transistors $Q_2$ and $Q_3$. When the phase shifts are in balance, the phase changes or delays between the components of current in the collector circuit of transistor $Q_3$ as propagated through the two separate paths are equal, tending to stabilize operation of the circuit.

When the signal conditions at one or more of the input terminals 10, 11, and 12 is changed to the low level voltage, as may be produced at the output of a similar logic circuit in the "on" condition, a base-emitter junction of the input transistor $Q_1$ is forward biased. Increased current flow through resistances $R_1$ and $R_2$ reduces the voltage at the base of the input transistor $Q_1$ thereby preventing current flow from the collector of transistor $Q_1$ into the base of the output coupling transistor $Q_2$. With the input transistor $Q_1$ in this condition no base drive current is available to transistor $Q_2$ and consequently none is available to the output transistor $Q_3$, and both transistors are biased to non-conduction.

Since the output coupling transistor $Q_2$ and the output transistor $Q_3$ were both held out of saturation, there are no charge storage delays and the transistors switch rapidly to the non-conducting condition. The switching speed of transistor $Q_3$ is increased, to a certain extent, by negative base current caused by the voltage across the base-emitter junction of transistor $Q_3$ discharging through the base-emitter junction and the resistance $R_3$.

When the output transistor $Q_3$ is switched to a substantially non-conducting condition, the voltage at its collector increases. This increase in voltage at the emitter of the clamping transistor $Q_5$ together with the decreased voltage at the base of the clamping coupling transistor $Q_4$ causes both transistors $Q_4$ and $Q_5$ to be biased to a substantially non-conducting condition. The clamping transistor $Q_5$ and the output transistor $Q_3$ thus provide a high impedance path between the output terminal 13 and ground.

When the output transistor $Q_3$ is switched to the non-conducting condition, the voltage at the base of the voltage setting transistor $Q_6$ increases while the voltage at its emitter is at the low voltage level of the output terminal 13. The voltage setting transistor $Q_6$ is thus biased to a conducting condition. This transistor conducts heavily to drive the load on the output until the voltage at the output terminal 13 reaches the predetermined high level established by the voltage of the B+ voltage source less the leakage current voltage drop across the resistance $R_4$ and the base-emitter junction of the voltage setting transistor $Q_6$. Restoration of the voltage at the output terminal to this higher level biases the voltage setting transistor $Q_6$ to its substantially non-conducting condition.

Fast switching to the "off" condition is accomplished by rapid switching of the output transistor $Q_3$ to the non-conducting condition, as explained, and the capability of the voltage setting transistor $Q_6$ to provide heavy driving current to charge the load capacitance, even with high fan-out. Although the clamping transistor $Q_5$ operates in saturation when the circuit is "on," this condition does not adversely affect the speed with which the circuit is switched "off." Current from the voltage setting transistor $Q_6$ does not flow into the collector of the clamping transistor $Q_5$ because the biasing conditions at the emitter and base of transistor $Q_5$ are such that no current can flow in the base or emitter circuits. Thus, none of the voltage setting transistor current flow is diverted from the output load to overcome the charge which became stored in the clamping transistor $Q_5$ while it was in saturation.

In addition to providing high speed switching under conditions of high fan-out and capacitive loads, the circuit according to the invention has good immunity to noise by virtue of the two widely separated voltage levels at the output relative to the input threshold. In the "off" condition with the high voltage level signal condition at the ouput terminal, the transistors are in a substantially non-conducting condition causing low power drain. The circuit employs only transistors of one conductivity type, resistances, and a diode, and, therefore, readily may be fabricated as a monolithic integrated circuit network.

Various modifications may be made in the circuit as shown. For example, a fairly large resistance may be connected between the B+ voltage source and the emitter of the clamping coupling transistor $Q_4$ in order to prevent this point from floating when the circuit is "off." With this arrangement the forward biasing of the clamping transistor $Q_5$ is speeded up when the circuit switches to the "on" condition. In addition, the circuit may be modified to provide an AND-or-INVERT function by connecting a duplicate of the network including transistors $Q_1$, $Q_2$, and $Q_4$ and resistances $R_1$ and $R_2$ directly parallel with the emitter of transistor $Q_2$ and the emitter of transistor $Q_4$ and with an appropriate connection to the B+ voltage source.

While there has been shown and described what is considered a preferred embodiment of the present invention, it will be obvious to those skilled in the art that various changes and modifications may be made therein without departing from the invention as defined in the appended claims.

What is claimed is:

1. A logic circuit including in combination
input circuit means having a first operating condition and a second operating condition,
output circuit means including an output transistor,
means connecting the input circuit means to the output transistor and operable to bias the output transistor to a substantially non-conducting condition when the input circuit means is in the first operating condition and operable to bias the output transistor to a conducting condition when the input circuit means is in the second operating condition,
clamping circuit means including a clamping transistor having emitter, base, and collector electrodes,
a first electrode of the clamping transistor being connected to the collector of the output transistor and a second electrode of the clamping transistor being connected to an output terminal, and
means connecting the input circuit means to the third electrode of the clamping transistor,
said last-mentioned means being operable to bias the clamping transistor to a substantially non-conducting condition when the input circuit means is in the first operating condition and the output transistor is in the substantially non-conducting condition thereby providing a high impedance path from the output terminal through the clamping transistor and the output transistor, and being operable to bias the clamping transistor to a conducting condition when the input circuit means is in the second operating condition and the output transistor is in the conducting condition to control the voltage at the collector of the output transistor and prevent the output transistor from operating in saturation thereby providing a low impedance path from the output terminal through the clamping transistor and the output transistor.

2. A logic circuit including in combination
input circuit means having a first operating condition and a second operating condition,
output circuit means including an output transistor having its emitter connected to a source of reference potential,
means connecting the input circuit means to the base of the output transistor and operable to bias the output transistor to a substantially non-conducting condition when the input circuit means is in the first operating condition and operable to bias the output transistor to a conducting condition when the input circuit means is in the second operating condition,
clamping circuit means including a clamping transistor having its emitter connected to the collector of the output transistor and its collector connected to an output terminal,
means connecting the input circuit means to the base of the clamping transistor and operable to bias the clamping transistor to a substantially non-conducting condition when the input circuit means is in the first operating condition and the output transistor is in the subtsantially non-conducting condition thereby providing a high impedance path between the output terminal and the source of reference potential, and operable to bias the clamping transistor to a conducting condition when the input circuit means is in the second operating condition and the output transistor is in the conducting condition to control the voltage at the collector of the output transistor and prevent the output transistor from operating in sauration thereby providing a low impedance path between the output terminal and the source of reference potential.

3. A logic circuit according to claim 2 wherein
said input circuit means includes an input transistor,
said means connecting the input circuit means to the base of the output transistor is connected to the collector of the input transistor, and
said means connecting the input circuit means to the base of the clamping transistor is connected to the base of the input transistor.

4. A logic circuit according to claim 2 wherein
a first predetermined voltage level is established at the output terminal when the output transistor and the clamping transistor are in conducting condition, and including
a voltage setting circuit means including a voltage setting transistor,
means connecting the emitter of the voltage setting transistor to the ouput terminal and the base of the voltage setting transistor to the collector of the output transistor, said means being operable to bias the voltage setting transistor to a substantially non-conducting condition when the output transistor is in the conducting condition, being operable to bias the voltage setting transistor to a conducting condition when the output transistor is in the substantially non-conducting condition and the output terminal is at the first predetermined voltage level tending to change the voltage level at the output terminal from the first predetermined level to a second predetermined level, and being operable to bias the voltage setting transistor to the substantially non-conducting condition when the output terminal is at the second predetermined voltage level.

5. A logic circuit including in combination
input circuit means including an input transistor,
said input transistor being biased to a first conduction condition in response to a first predetermined condition at the input thereto and being biased to a second conduction condition in response to a second predetermined condition at the input thereto,
output circuit means including an output transistor having its emitter connected to a source of reference potential,
means including an output coupling transistor connecting the collector of the input transistor to the base of the output transistor and operable to bias the output transistor to a substantially non-conducting condition when the input transistor is in the first conducting condition and operable to bias the output transistor to a conducting condition when the input transistor is in the second conducting condition, clamping circuit means including a clamping transistor having its emitter connected to the collector of the output transistor and its collector connected to an output terminal, means including a clamping coupling transistor connecting the base of the input transistor to the base of the clamping transistor and operable to bias the clamping transistor to a substantially non-conducting condition when the input transistor is in the first conducting condition and the output transistor is in the substantially non-conducting condition, and operable to bias the clamping transistor to a conducting condition when the input transistor is in the second conducting condition and the output transistor is in the conducting condition to control the voltage at the collector of the output transistor and prevent the output transistor from operating in saturation, a first predetermined voltage level being established at the output terminal when the clamping transistor and the output transistor are in conducting condition, a voltage setting circuit means including a voltage setting transistor having its emitter connected to the output terminal, means connecting the base of the voltage setting transistor to the collector of the output transistor, said means being operable to bias the voltage setting transistor to a substantially non-conducting condition when the output transistor is in the conducting condition, being operable to bias the voltage setting transistor to a conducting condition when the output transistor is in the substantially non-conducting condition and the output terminal is at the first predetermined voltage level tending to change the voltage level at the output terminal from the first predetermined level to a second predetermined level, and being operable to bias the voltage setting transistor to the substantially non-conducting condition when the output terminal is at the second predetermined voltage level.

6. A logic circuit according to claim 5 wherein said input transistor is a multiple-emitter transistor having its base connected through an input resistance to another source of reference potential and having input connections at its emitters, said output coupling transistor has its base connected to the collector of the input transistor, its collector connected to said other source of reference potential, and its emitter connected to the base of the output transistor, said output transistor has its collector connected directly to the emitter of the clamping transistor and through resistance means to said other source of reference potential, said input transistor being biased to the first conducting condition during the presence of a signal condition at at least one of the emitters of the input transistor forward biasing the base-emitter junction of the input transistor and causing heavy current flow through said input resistance whereby the potential at the base prevents current flow from the collector to the base of the output coupling transistor biasing the output coupling transistor to the substantially non-conducting condition, and being biased to the second conducting condition during the presence of signal conditions at all of the emitters of the input transistor reverse biasing the base-emitter junctions of the input transistor and causing low current flow through said input resistance whereby the potential at the base causes current flow from the collector to the base of the output coupling transistor biasing the output coupling transistor to the conducting condition, said clamping coupling transistor has its base connected to the base of the input transistor, its emitter connected to the base of the clamping transistor, and its collector connected to the input resistance at a point between the other source of reference potential and the base of the input transistor whereby when said input transistor is in the second conducting condition and the output transistor is in the conducting condition the base-emitter junctions of the clamping coupling transistor and the clamping transistor are forward biased causing current to flow in the collectors of the clamping coupling transistor and the clamping transistor and establishing a voltage level at the collector of the output transistor determined by the voltage at the base of the input transistor and the voltage drop across the base-emitter junctions of the clamping coupling transistor and the clamping transistor, and said voltage setting transistor has its collector connected to said other source of reference potential and its base connected to the collector of the output transistor.

References Cited

UNITED STATES PATENTS

| | | | |
|---|---|---|---|
| 3,233,125 | 2/1966 | Buie | 307—215 |
| 3,287,577 | 11/1966 | Hung et al. | 307—215 |

DONALD D. FORRER, Primary Examiner

U.S. Cl. X.R.

307—214, 237